Nov. 7, 1967 J. C. MARINACE 3,351,698

HEAT SINK MOUNTING FOR SEMICONDUCTOR DEVICES

Filed Nov. 13, 1964

*INVENTOR.*
JOHN C. MARINACE

*BY* S. P. Tedesco

ATTORNEY 3,351,698

HEAT SINK MOUNTING FOR SEMICONDUCTOR DEVICES

John C. Marinace, Yorktown Heights, N.Y., assignor to International Business Machines Corporation, Armonk, N.Y., a corporation of New York Filed Nov. 13, 1964, Ser. No. 411,062
7 Claims. (Cl. 174—15)

This invention relates to heat dissipation systems and, more particularly, to heat sink mountings for stabilizing the operating temperature of a semiconductor device Generally, semiconductor devices are temperature sensitive and proper cooling of such device is required to stabilize their operating characteristics. For example, it has been common to provide mountings, e.g., headers, etc., for semiconductor devices which serve as heat radiators, or heat sinks, to dissipate self-induced heat in the devices to an ambient, e.g., atmosphere, liquid coolant baths, etc. Such mountings, in effect, increase the heat transferring surface of the semiconductor device and, therefore, the effective rate of heat dissipation to the ambient. Prior art heat sink mountings, however, are not particularly suitable to transfer large quantities of self-induced heat and are unsatisfactory where operating characteristics of the semiconductor device vary appreciably with changes in operating temperature. Moreover, because of the microminiature dimensions of present day semiconductor devices, the area of the effective heat transferring surface is limited by practical considerations.

A present day semiconductor device which exhibits a critical temperature dependence is the semiconductor diode (gallium arsenide) injection laser. A very critical parameter of laser performance is the threshold current $I_t$ for coherent light output which is very sensitive to changes in junction temperature $T_j$; the frequency of the coherent light output also varies due to changes in the index of refraction of the semiconductor material. The critical dependence of laser operation on temperature has been reported, for example, in "CW Operation of a GaAs Injection Laser," by W. E. Howard et al., IBM Journal of Research and Development, vol. 7, pages 74 through 75, January 1963, and, also, in "CW Operation of GaAs Injection Lasers," by M. F. La Morte et al., *Proceedings* of the IEEE, vol. 52, No. 10, pages 1257 through 1258, October 1964. It has been observed that, when operated at elevated temperatures, i.e., in excess of 20° K., the change in threshold current $I_t$ is proportional to $T_j^3$. To minimize threshold current $I_t$ and obtain usefully high-power output, diode lasers are operated at very low temperatures, e.g., in the range of liquid helium (4.2° K.). At these low operating temperatures, threshold current $I_t$ of the diode laser is reduced sufficiently to achieve high-power continuous-wave operation. At more elevated temperatures, e.g., in the range of liquid nitrogen (77° K.), diode lasers are operated in pulsed manner to limit self-induced heat whereby variations in threshold current $I_t$ and, also, the frequency of the coherent light output are minimized. At these more elevated temperatures, present day heat sink mountings are ineffective to stabilize junction temperature $T_j$ to allow high-power continuous-wave operation; continuous-wave operation of diode lasers at 77° K. at very low output power levels, for example, is cited in the above-identified M. F. LaMorte et al article. At these more elevated temperatures, diode lasers are generally operated in pulsed manner immediately above the threshold current $I_t$ whereby the power output is significantly low. The power output can be significantly increased at these more elevated temepratures if the efficiency of the heat sink mounting is improved to minimize changes in junction temperature $T_j$ due to self-induced heating of diode laser.

Accordingly, a need exists for an efficient heat sink mounting suitable for solid-state devices of microminiature dimensions. While the critical temperature dependence of diode lasers has been mentioned, efficient heat sink mountings are desirable regardless of the degree of temperature sensitivity of the semiconductor devices, e.g., varactor diodes, transistors, etc. Further, the structure of such mountings should be such that semiconductor devices of microminiature dimensions can be easily mounted without the application of heat. The application of heat to particular semiconductor devices, for example, diode lasers, subsequent to the completed fabrication proces can have serious effects. In the case of diode lasers, conventional soldering processes can be detrimental to the lasing properties.

Accordingly, an object of this invention is to provide an improved heat sink mounting for semiconductor devices.

Another object of this invention is to provide an improved heat dissipation system for minimizing variations in operating temperatures of semiconductor devices due to self-induced heating.

Another object of this invention is to provide an improved heat sink mounting for semiconductor devices which is inexpensive to fabricate and wherein mounting of such devices is facilitated.

Another object of this invention is to provide a heat sink mounting for semiconductor devices which effect electrical contacts to such devices without the application of heat.

Another object of this invention is to provide highly-efficient heat sink mountings for semiconductor diode injection lasers such that usefully high-power outputs can be obtained at usefully high operating temperatures, e.g., in the range of and in excess of 77° K.

These and other objects and features of this invention are obtained in accordance with a preferred embodiment of this invention by forming the heat sink mounting of a pair of planar conductive members rigidly supported parallel to each other and formed of suitable resilient material. Surfaces of the conductive members which contact the semiconductor device terminals are coated with a thin layer of soft conductive material having plastic properties; the conductive members are critically spaced to provide firm pressure contact on the terminals of the semiconductor device. In addition, the crystal surfaces of the semiconductor device, which define terminals, are also coated with a thin film of a same or similar soft conductive material. The pressure exerted by the conductive members is at least sufficient to form an electrical connection in the nature of a cold weld, i.e., a single metallurgical phase, between the opposing thin films of soft conductive material whereby electrical access is provided to the semiconductor device. Also, self-induced heat in the semiconductor device is transferred by conduction along the conductive members and is dissipated in the ambient. Since electrical connections between opposing thin films are made without heat, the efficiency of the heat sink mounting is optimized because of the reduced number of metallurgical barriers present along the heat conduction path; also, the impedance along the defined electrical conduction path is reduced for the same reason.

The foregoing and other objects, features and advantages of this invention will be apparent from the following more particular description of preferred embodiments of the invention, as illustrated in the accompanying drawings.

Figures 1, 2, 3:
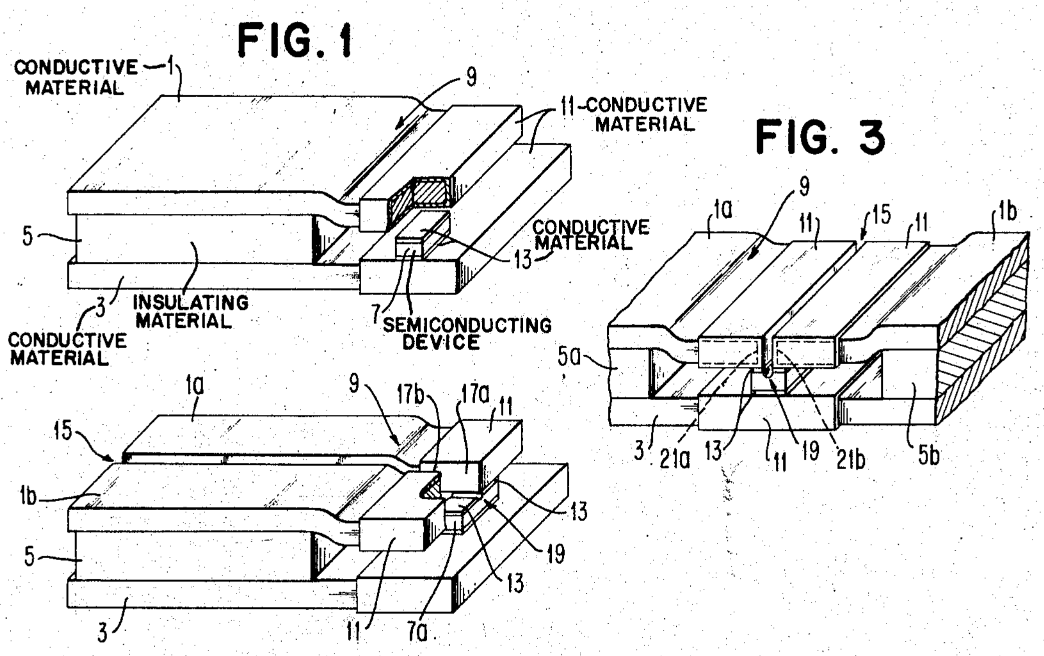
FIG. 1 is a cabinet view of a two-terminal mounting in accordance with this invention supporting a diode laser.
FIGS. 2 and 3 are cabinet views of three-terminal heat sink mountings in accordance with this invention.

Referring to FIG. 1, a heat sink mounting incorporating the principles of this invention includes first and second planar members 1 and 3 rigidly bonded at one end on insulating spacer 5 whereby free ends are supported in spaced-parallel fashion. Members 1 and 3 are formed of resilient conductive material exhibiting good thermal conduction properties and, in addition, coefficients of linear expansion compatible with that of the semiconductor material forming semiconductor device 7, herein illustrated as a GaAs diode laser. Suitable materials for forming members 1 and 3 include molybdenum (Mo), copper (Cu), silver (Ag), tungsten (W), etc. For example, when members 1 and 3 are formed of molybdenum, such members are fashioned of ordinary annealed stock and need not be of exceptionally high purity. Members 1 and 3 are critically spaced to allow insertion of diode laser 7 and provide firm pressure contacts thereon.

Spacer 5 is formed of appropriate insulating material, e.g., semi-insulating gallium arsenide, "Pyrex," glass, ceramic beryllium oxide (BeO), ceramic aluminum oxide ($Al_2O_3$) or other insulating material having good thermal conduction properties. The thickness of spacer 5 is greater than the spacing between free ends of members 1 and 3 to facilitate bonding and, also, minimize the possibility of shorts between the members; also, the insulating material should exhibit a low dielectric constant to minimize the inherent capacitance of the heat sink structure. Care should be exercised to insure that free ends of members 1 and 3 are supported in parallel fashion to contact diode laser 7. Further, it is desirable that the thermal contraction of spacer 5 is greater than that of diode laser 7 so that, when immersed in a liquid coolant bath, e.g., nitrogen (77° K.), not shown, diode laser 7 is subjected to increased compressive stress which is often desirable. To this end, the plane of member 1 is offset by bend 9. Bend 9 in member 1 determines the spacing between free ends of members 1 and 3 and, also, provides elasticity to the free end of member 1. If pressure on a semiconductor device is to be maintained substantially constant, spacers of insulating material and having very low coefficients of linear expansion can be inserted between free ends of members 1 and 3.

When members 1 and 3 have been bonded to spacer 5, the structure of FIG. 1 is subject to an electroplating process to coat, or cap, free ends of members 1 and 3 with thin films 11 of soft conductive material, e.g., within but not limited to the range of 10 to 20 microns. Suitable soft conductive materials include, for example, indium (In), tin (Sn), and soft alloys thereof. For example, unconnected ends of members 1 and 3 can be dipped in an indium fluobarate, $In(BF_4)_3$, solution for approximately 15 minutes and subjected to a current density of 2 milliamperes/cm.$^2$ or surface area. Conventional masking techniques can be employed, if desired, to provide thin films 11 only on opposing surface areas of members 1 and 3 which contact diode laser 7. The two-terminal heat sink mounting is now fully formed and diode laser 7 can be inserted.

In accordance with this invention, the major faces of laser 7 are coated with a thin film 13 of a same or similar soft conductive material forming thin films 11 covering free ends of members 1 and 3. Thin films 13 of soft conductive material can be formed as an intermediate step in fabrication of diode laser 7. For example, a process for fabricating diode injection lasers of gallium arsenide (GaAs) has been described in the copending patent application Ser. No. 260,020, filed in the name of F. H. Dill, Jr., entitled, "Crystalline Device Manufacture," on Feb. 20, 1963, and assigned to a common assignee (note FIG. 4C). As described, diode lasers are formed by exposing an N-type gallium arsenide wafer, having at least one crystal face properly lapped and cleaned, to a zinc arsenide (ZnAs) atmosphere for approximately two hours at approximately 850° and PN junctions are diffused in parallel and extensive with opposing crystal faces. After diffusion, the unpolished crystal face of the wafer is lapped away whereby a single PN junction is defined. Successive thin layers, each less than one micron, of gold (Au), and tin (Sn) are deposited on the wafer. For example, the gold layer can be electrolessly plated on the wafer by a 10 second immersion in a solution of one gram of $HAuCl_4$ in 800 ml. of $H_2O$ plus 200 ml. HF. Also, the tin layer can be electrolessly plated over the thin gold layer by a 30 second immersion in a solution of .66 oz. of $$SnCl_2 \cdot H_2O + .7 \text{ oz. } NaOH + 6.7 \text{ oz. } NaCN$$

in a gallon of $H_2O$. The plated wafer is then heated to 400° C. for several seconds in a nonreactive atmosphere to "alloy" the gold and thin layers into the wafer. The "alloyed" wafer is then subjected to the intermediate step of electroplating a thin layer 13, for example, of indium by the process hereinabove described. The wafer along with thin film 13 is then "cleaved" into bars, the "cleaved" surface being parallel and optically partially reflective, as described in the above-identified patent application Ser. No. 260,020. Since thin films 13 adhere strongly to the wafer surface, "cleavage" does not damage such films. Resultant bars are then cut perpendicular to the "cleaved" surfaces and are nonreflecting so as to form individual diode lasers of a Fabry-Pérot configuration having thin conductive films 13 on surfaces parallel to the plane of the PN junction. Diode laser 7 is easily inserted by wedging the free ends of members 1 and 3 apart, for example, by a small pointed rod while the heat sink mounting is supported at the bonded end in a small vise. Diode laser 7 is positioned such that thin films 11 and 13 are opposing and, when members 1 and 3 are released, the pressure contact between such opposing films is sufficient to cause a slight intermixing therebetween and form a joint similar to a cold weld. The position of diode laser 7 relative to bend 9 in upper member 1 determines, to a considerable extent, the compressive stress applied across the diode laser when the structure is immersed in a liquid coolant bath, not shown, due to thermal contraction in the region of spacer 5. When positioned near bend 9, a significant compressive stress is applied across diode laser 7; however, by positioning diode laser 7 remote from bend 9, the compressive stress on diode laser 7 is maintained more nearly constant and tends to minimize any effects of thermal contraction in the region of spacer 7. Thermal cycling of the heat sink mounting, for example, between room temperature and liquid nitrogen temperature (77° K.), can be effected without danger of damage to diode laser 7 since members 1 and 3 and, also, the semiconductor device 7 preferably have similar coefficients of linear expansion and thin films 11 and 13 having sufficient plasticity to compensate for any slight mismatch. Also, suitable insulating potting material, not shown, can be placed between members 1 and 3 to provide added strength to the heat sink mounting structure. Such potting material should exhibit a very low coefficient of linear expansion, a low dielectric constant, and, when optical semiconductor devices are mounted, should be substantially transparent.

Alternate embodiments of the heat sink mounting of this invention are illustrated in FIGS. 2 and 3 respectively, for effecting three-terminal connections, for example, a bistable, or two-input diode laser *7a* of the type shown in copending application Ser. No. 367,106, entitled "Multistable Maser Devices," filed on May 13, 1964 in the name of Gordon J. Lasher and assigned to a common assignee.

The three-terminal heat sink mounting of FIG. 2 is similar to FIG. 1 and similar reference characters are employed to identify corresponding structures. In FIG. 2, a pair of upper members 1*a* and 1*b* are rigidly bonded on spacer 5 such that free ends are supported in parallel fashion and at a same critical spacing from member 3; in addition, members 1*a* and 1*b* are electrically insulated by air-gap 15 to allow separate electrical connections to the terminals of diode laser 7*a*. Alternatively, a thin insulating film, e.g., molybdenum oxide ($MoO_3$), can be formed by known processes on either or both of sides 17*a* and 17*b* of members 1*a* and 1*b*, respectively. The thin insulating film, not shown, provides controlled spacing and insulation between the members 1 and 3; if desired, such thin insulating film can be etched to define air-gap 15 subsequent to the bonding of members 1*a* and 1*b* to spacer 5.

The fabrication process of the heat sink mounting structure of FIG. 2 is identical for all practical purposes so that hereinabove described with respect to FIG. 1. When fabricating the bistable, or two-terminal, laser 7*a*, notch 19 defines the distinct contacting surface each covered by a thin film 13 of soft conductive material. The lateral dimensions of air-gap 15 and notch 19 in diode laser 7*a*, respectively, are substantially identical. Diode laser 7*a* is positioned by concurrently wedging members 1*a* and 1*b* and 3, as hereinabove described, such that air-gap 15 and notch 19 are aligned and pressure contacts are made between opposing thin films 11 and 13 when the members are released.

In the heat sink mounting of FIG. 3, members 1*a* and 1*b* are bonded on spacers 5*a* and 5*b*, respectively, free ends being supported in parallel fashion and at a same critical spacing from member 3. In the present embodiment, air-gap 15 is defined between thin films 11 over sides 21*a* and 21*b* of members 1*a* and 1*b*, respectively. The heat sink mounting of FIG. 3 is fabricated by techniques similar to those hereinabove described. To insert the device 7*a* in the structure of FIG. 3, members 1*a* and 1*b* are concurrently wedged and diode laser 7*a* is inserted such that air-gap 15 and notch 19 are aligned and pressure contacts made between opposing thin films 11 and 13. The particular patterns of thin films 11 formed on members 1*a*, 1*b*, and 3 can be formed by appropriate masking techniques.

Figure 4:
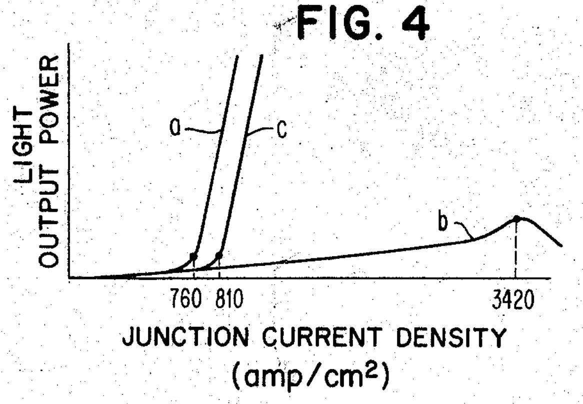
FIGS. 4 and 5 are graphs illustrating heat transfer efficiency of heat sink mountings in accordance with this invention.

The efficiency of the heat sink mountings of this invention can be appreciated by referring to FIG. 4 wherein variations in threshold current $I_t$ as related to junction temperature $T_j$ of a diode laser is shown when supported, for example, in a heat sink mounting as illustrated in FIG. 1 and in prior art heat sink mountings. As illustrated, threshold current $I_t$ of a gallium arsenide diode laser has a spectral output of ~8400 A. when operated at liquid nitrogen temperatures (77° K). The operation of such a diode laser also supported in a prior art heat sink mounting when pulses of 0.1 microsecond duration are applied at 100 pulses/sec. is illustrated by curve *a*, threshold current $I_t$ being approximately 760 amp/cm.$^2$. As hereinabove indicated, threshold current $I_t$ varies by a factor of $(T_j/77)^3$ where $T_j$ is the increased junction temperature and 77 indicates the junction temperature at liquid nitrogen temperatures. When the diode laser, thus mounted, is operated continuous-wave, power input is increased by a factor of $10^5$ and the self-induced heating is not dissipated at a sufficiently high rate to prevent increase in junction temperature $T_j$. As illustrated by curve *b*, junction temperature $T_j$ of the laser device increases substantially and the accompanying rise in threshold current $I_t$ precludes high-power continuous-wave operation. Accordingly, light output from the laser device is minimal whereas input power is substantial. The junction temperature $T_j$ could change by 50° K., as represented by curve *b*, whereby threshold current $I_t$ increases by a factor of 4.5 or to approximately 3420 amp/cm.$^2$ which far exceeds the limits of present day diode lasers. However, the efficiency of the heat sink mount incorporating the principles of this invention is indicated by curve

Figure 5:
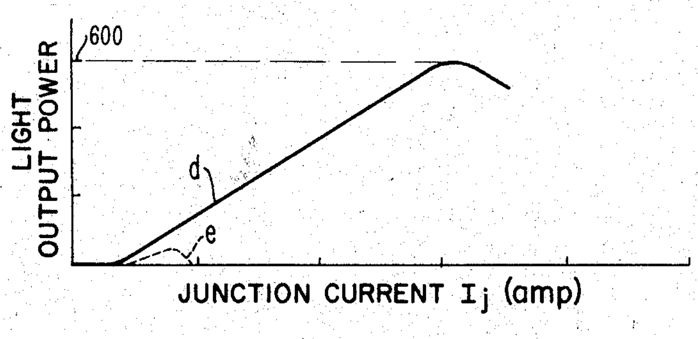

*c* for identical conditions (curve *a* being employed as a reference). When the diode laser, thus mounted, is operated continuous-wave, threshold current $I_j$ is observed to increase only to approximately 810 amp/cm.$^2$ albeit input power is increased by a factor of $10^5$. This small change in threshold current $\Delta I_t$ is believed due to the minimum number of metallurgical phase boundaries in the heat conduction path of the heat sink mounting structure whereby self-induced heating is dissipated at a very rapid rate. Accordingly, high-power continuous-wave operation of diode lasers at elevated temperatures in the range of liquid nitrogen temperatures can be achieved. The ability to obtain high-power continuous-wave operation is graphically illustrated in the idealized curves of FIG. 5 wherein light output from a diode laser is plotted against junction current $I_j$. When diode laser is supported within a heat sink mounting of this invention, as indicated by curve *d*, light output intensity increases continuously for increasing junction current $I_j$; when junction currents $I_j$ are well in excess of 3 amperes, the light output level declines indicating that the junction temperature $T_j$ is increasing at a more rapid rate than self-generated heat can be dissipated by the heat sink mounting. When the diode laser is supported in prior art heat sink mountings, as indicated by curve *e*, significant light output intensity is not obtained even when the diode laser is operated in pulsed manner at a high repetition rate. Curve *e* of FIG. 5, although somewhat exaggerated, indicates that prior art heat sink mountings are almost completely inoperative to dissipate sufficient self-induced heat to obtain a useable level of light output in the range of liquid nitrogen temperatures. As illustrated, curve *d* peaks at approximately 600 milliwatts whereas curve *e* peaks well in the microwatt range indicating that a heat sink mounting incorporating the principles of this invention is many orders of magnitude more effective than prior art heat sink mountings.

While particular embodiments have been described, it is obvious that many variations in the preferred structure can be made by one skilled in the art without departing from the spirit of the invention. For example, if desired, an aperture can be provided in one of the conductive members to allow an exit for radiation when the supported semiconductor device is an electroluminescent diode.

While the invention has been particularly shown and described with reference to preferred embodiments thereof, it will be understood by those skilled in the art that various changes in form and details may be made therein without departing from the spirit and scope of the invention.

What is claimed is:

1. A heat sink mounting comprising a pair of planar members formed of resilient conductive material and rigidly supported at one end portion on an insulating spacer in parallel electrically-insulated relationship, a semiconductor device inserted between the other end portion of said planar members and having planar areas defining terminal contacts which are disposed adjacent to opposing surfaces of said planar members, a thin film of conductive material formed over at least said opposing surface areas of said planar members and over said planar areas of said semiconductor device, the thickness of said insulating spacer being effective to determine the normal spacing between said opposing surface areas of said planar members such that pressure contact is made between engaging thin films on said planar members and said semiconductor device at least sufficient to provide electrical conductivity between said planar members and said semiconductor device.

2. A heat sink mounting as defined in claim 1 wherein the thickness of said insulating spacer is in excess of said normal spacing, at least one of said planar members being offset to define said normal spacing between said opposing surface of said planar members.

3. A heat sink mounting comprising first and second planar members and a third planar member each formed of resilient conductive material, an insulating spacer, said first, second and third planar members being bonded to said insulating spacer such that said first and second planar members are supported in spaced parallel relationship with said third planar member, a semiconductor device having planar areas defining terminal contacts, a thin film of first conductive material formed at least over portions of opposing surfaces of said first, second and said third planar members and planar areas of said semiconductor device, said device being inserted between said portions of said first, second and third planar members whereby corresponding thin films are contacted, the normal spacing between said portions of said first and second planar members and said third planar member being such that pressure is applied across said contacted thin films sufficient to provide electrical conductivity therebetween and said device.

4. A heat sink mounting comprising first, second and third planar members each formed of resilient conductive material, first nad second insulating spacers, said first and third planar members being bonded to said first spacer such that unbonded portions are supported in spaced parallel relationship, said second and third planar members being banded to said second spacer such that unbonded portions are supported in spaced parallel relationships, a semiconductor device having planar areas defining terminal contacts, a thin film of conductive material formed over at least portions of opposing surfaces of said first and second planar members and said third planar member, said semiconductor device being inserted between said first and second planar members and said third planar member such that said thin films formed thereover and over said planar areas of said semiconductor device are contacted, the normal spacing between said first, second and third planar members providing firm pressure on said contacted thin films sufficient to provide electrical conductivity therebetween and said semiconductor device.

5. A heat sink mounting comprising a pair of planar members formed of resilient conductive material and rigidly supported at one end portion on an insulating spacer in parallel electrically-insulated relationship, a semiconductor device inserted between the other end portion of said planar members and having planar areas defining terminal contacts which are disposed adjacent to opposing surface areas of said planar members, a thin film of conductive material interposed between said opposing surface areas of said planar members and said planar areas of said semiconductor device, the thickness of said insulating spacer being effective to determine the normal spacing between said opposing surface areas of said planar members such that pressure contact is made to said thin film at least sufficient to provide electric conductivity between said planar members and said semiconductor device.

6. A heat sink mounting comprising first and second planar members and a third planar member each formed of resilient material, at least two of said planar members being formed of conductive material, an insulating spacer, said first, second and third planar members being bonded to said insulating spacer such that the surface of said first and second planar members are supported in spaced-parallel relationship with the surface of said third planar member, a semiconductor device having planar areas defining terminal contacts, a thin film of first conductive material interposed between opposing surfaces of said at least two planar members and said planar areas of said semiconductor device defining terminal contacts, said semiconductor device being inserted between said first, second and third planar members, the normal spacings between said first and second planar members and said third planar member being such that pressure is applied across said interposed thin film sufficient to provide electrical continuity between said at least two planar members and said semiconductor device.

7. A heat sink mounting comprising first, second and third planar members each formed of resilient material, at least two of said planar members being formed of conductive material, first and second insulating spacers, said first and third planar members being bonded to said first spacer such that unbonded portions are supported in spaced-parallel relationship, said second and third planar members being bonded to said second spacer such that unbonded portions are supported in spaced-parallel relationship, a semiconductor device having planar areas defining terminal contacts, a thin film of conductive material interposed between opposing surfaces of said at least two planar members and said planar areas of said semiconductor device defining terminal contacts, said semiconductor device being inserted between said first and second planar members and said third planar member, the normal space between said first, second and third planar members being such that pressure is applied across said interposed thin film sufficient to provide electrical continuity between said at least two planar members and said semiconductor device.

References Cited

UNITED STATES PATENTS

| | | | |
|---|---|---|---|
| 3,226,466 | 12/1965 | Martin | 174—15 |
| 3,238,425 | 3/1966 | Geyer | 174—52 |

DARRELL L. CLAY, *Primary Examiner.*

LEWIS H. MEYERS, *Examiner.*

J. F. RUGGIERO, *Assistant Examiner.*